US012227833B2

(12) United States Patent
Jiang et al.

(10) Patent No.: US 12,227,833 B2
(45) Date of Patent: Feb. 18, 2025

(54) PREPARATION DEVICE AND PREPARATION METHOD FOR ALLOY TARGETS

(71) Applicant: Supermag Technology (Shanghai) Co., Ltd., Shanghai (CN)

(72) Inventors: Guangyu Jiang, Shanghai (CN); Chunsheng Cheng, Shanghai (CN); Yue Zhao, Shanghai (CN)

(73) Assignee: Supermag Technology (Shanghai) Co., Ltd., Shanghai (CN)

( * ) Notice: Subject to any disclaimer, the term of this patent is extended or adjusted under 35 U.S.C. 154(b) by 59 days.

(21) Appl. No.: 18/389,845

(22) Filed: Dec. 20, 2023

(65) Prior Publication Data

US 2024/0360544 A1 Oct. 31, 2024

(30) Foreign Application Priority Data

Apr. 28, 2023 (CN) .......................... 202310488835.5

(51) Int. Cl.
*C23C 14/34* (2006.01)
*B22F 10/28* (2021.01)
(Continued)

(52) U.S. Cl.
CPC .......... *C23C 14/3414* (2013.01); *B22F 10/28* (2021.01); *B22F 12/41* (2021.01);
(Continued)

(58) Field of Classification Search
CPC ......... B33Y 10/00; B33Y 30/00; B33Y 40/00; B33Y 80/00; B22F 12/53; B22F 12/90;
(Continued)

(56) References Cited

U.S. PATENT DOCUMENTS

2017/0173611 A1* 6/2017 Tan ........................ B05B 7/1486
2021/0187618 A1* 6/2021 Irissou .................... C23C 24/08

FOREIGN PATENT DOCUMENTS

JP 2017025385 A * 2/2017
JP 2019518865 A 7/2019
(Continued)

OTHER PUBLICATIONS

JP-2017025385-A English translation (Year: 2017).*

*Primary Examiner* — Ricardo D Morales

(57) ABSTRACT

A preparation device for an alloy target includes a material nozzle, a high-energy laser, and a target support substrate, the material nozzle and the high-energy laser are respectively arranged above the target support substrate. The preparation device uses the material nozzle to spray the material powder required for the alloy target to be prepared, the injection efficiency is independently adjusted to achieve the purpose of non-fixed composition of the alloy target, and the spatial position and angle of the material nozzle are independently adjusted to ensure uniform composition and density of the target, the high-energy laser beam generated by the high-energy laser is used to heat the material powder in the spraying area to form a target coating of the required composition, the target support substrate is used to support the target coating formed by the material powder.

3 Claims, 3 Drawing Sheets

(51) Int. Cl.
  *B22F 12/41* (2021.01)
  *B22F 12/53* (2021.01)
  *B22F 12/55* (2021.01)
  *B22F 12/90* (2021.01)
  *B33Y 10/00* (2015.01)
  *B33Y 30/00* (2015.01)
  *B33Y 40/00* (2020.01)
  *B33Y 80/00* (2015.01)
  *C23C 24/08* (2006.01)

(52) U.S. Cl.
  CPC .............. *B22F 12/53* (2021.01); *B22F 12/55* (2021.01); *B22F 12/90* (2021.01); *B33Y 10/00* (2014.12); *B33Y 30/00* (2014.12); *B33Y 40/00* (2014.12); *B33Y 80/00* (2014.12); *C23C 24/087* (2013.01); *B22F 2301/056* (2013.01); *B22F 2301/10* (2013.01); *B22F 2998/10* (2013.01)

(58) Field of Classification Search
  CPC ... C23C 14/3414; C23C 14/34; C23C 24/087; C23C 24/085; C23C 24/04
  See application file for complete search history.

(56) References Cited

FOREIGN PATENT DOCUMENTS

| | | |
|---|---|---|
| JP | 2021085041 A | 6/2021 |
| WO | 2016151781 A1 | 9/2016 |

* cited by examiner

PREPARATION DEVICE AND PREPARATION METHOD FOR ALLOY TARGETS

CROSS REFERENCE TO THE RELATED APPLICATIONS

This application is based upon and claims priority to Chinese Patent Application No. 202310488835.5, filed on Apr. 28, 2023, the entire contents of which are incorporated herein by reference.

TECHNICAL FIELD

The invention relates to the technical field of target material, in particular to a preparation device and a preparation method for alloy targets.

BACKGROUND

For vacuum coating processes such as magnetron sputtering and pulse laser deposition, the material of the film is migrated from the surface of the target, and the target is one of the core components. In recent years, the continuous development and iteration of vacuum coating technology has also greatly promoted the continuous progress of target preparation technology. According to the chemical composition and geometric shape of the target, the target has different classification methods. According to the chemical composition, the target can be divided into an oxide target, ceramic target, alloy target, elemental metal target, etc. According to the geometric shape, the target can be divided into plane target, anomalous target, and so on. Among all kinds of target materials, the preparation method of target materials with simple chemical composition and geometric shape is relatively simple, but the preparation of target materials with complex composition or geometric shape is still difficult.

Taking the alloy target with complex composition as an example, at present, the preparation methods for alloy targets with complex composition are mainly divided into two kinds: the casting method and the powder metallurgy method. When preparing the alloy target by the casting method, although the purity is high, the uniformity of the alloy is poor, especially when the melting point or density of the components are quite different, it is difficult to obtain the alloy target with uniform composition. When preparing the alloy target by the powder metallurgy method, a relatively uniform target material can be obtained, but its density is prone to uneven phenomenon, and it is difficult to prepare large-sized and anomalous targets.

On the other hand, some special coating scenes put forward new requirements for the targets. For example, in some applications, the composition of the film needs to change gradually and evenly or to be doped in some specific positions in the film, which requires the composition of the alloy target to change instead of being fixed. Traditional target preparation methods are powerless to meet this demand. Therefore, a method that can be used to produce large-size, anomalous, non-fixed alloy targets is an urgent problem to be solved in the existing technology.

SUMMARY

The purpose of the invention is to provide a preparation device and a preparation method for alloy targets, the alloy target preparation device provided by the invention can be used to produce large-size, anomalous, and non-fixed alloy targets to meet the special requirements of different coating scenes for the target.

In order to achieve the above purposes, the invention provides the following technical solutions:

The invention provides a preparation device for an alloy target, comprising a material nozzle, a high-energy laser, and a target support substrate;

the material nozzle is arranged above the target support substrate, which is used to spray material powder required for an alloy target to be prepared;

the high-energy laser is arranged above the target support substrate to generate a high-energy laser beam;

the target support substrate supports a target coating formed by the material powder and controls the size and shape of the target coating.

Preferably, the number of material nozzles is 3 to 5.

Preferably, the preparation device for alloy targets also comprises a controller; the controller is connected to the material nozzle, the high-energy laser, and the target support substrate.

The invention also provides a preparation method for an alloy target, comprising the following steps:

(1) preparing a required material powder according to a chemical element composition of the alloy target to be prepared;

(2) dividing the material powder in Step (1) into the material nozzle of the preparation device described in the above technical solution, and then adjusting a spatial position and angle of the material nozzle independently, so that a position and area of the material nozzle sprayed on the target support substrate are consistent, and obtaining a focusing surface of the same position and size;

according to a stoichiometric ratio of each element at a specific position of the alloy target to be prepared, adjusting an injection efficiency of the material nozzle independently, and turning on the high-energy laser, using the high-energy laser beam generated by the high-energy laser to synchronously heat the material powder sprayed on the target support substrate by the material nozzle, so that the material powder is fused to form a target coating;

in the process of the material powder injection, moving the target support substrate, and forming the target coating with the required size and shape by spraying;

after the spraying of the above target coating is completed, moving the target support substrate, and spraying an upper surface of the upper target coating continuously to form a target coating with a required size and shape for the next layer, and obtaining the alloy target by spraying layer by layer.

Preferably, the material powder in Step (1) is a simple substance or an alloy; the material powder is composed of micron-sized particles and/or nano-sized particles.

Preferably, an area of the focusing surface in Step (2) is 1-100 mm$^2$; a coincidence rate between the material nozzle and the focusing surface is >95%.

Preferably, when the alloy target is a periodically doped alloy target, the material nozzle in Step (2) obtains different focusing surfaces on the target support substrate; setting an injection mode of material nozzles on different focusing surfaces, and adjusting a working time of different injection modes to achieve periodic doping.

Preferably, the injection efficiency of the material nozzle in Step (2) is 0-100 mm$^3$/s independently.

Preferably, in Step (2), the target support substrate or the material nozzle moves with the high-energy laser in three-dimensional space; a relative velocity of the movement is 1-100 mm/s.

Preferably, after the cyclic layer-by-layer spraying in Step (2) is completed, it also comprises separating the alloy target coating obtained by the cyclic layer-by-layer spraying from the target support substrate to obtain the alloy target.

The invention provides a preparation device for an alloy target, comprising the material nozzle, the high-energy laser, and the target support substrate, the material nozzle and the high-energy laser are respectively arranged above the target support substrate. The invention uses the material nozzle to spray the material powder required for the alloy target to be prepared, and the number of the material nozzles varies according to the type of material powder required for the alloy target to be prepared. The injection efficiency of the material nozzle is independently adjusted and is set according to the stoichiometric ratio of each element at a specific position of the alloy target to be prepared, so as to meet the requirements of doping certain specific positions in the film layer in the coating scene and realize the purpose of non-fixed composition of the alloy target. The thickness of the single-layer target coating is controlled by adjusting the injection efficiency of the material nozzle, and the spatial position and angle of the material nozzle are independently adjusted. To ensure that the composition and density of the target are uniform; the high-energy laser beam generated by the high-energy laser is used to heat the target support substrate, the material powder sprayed on the surface of the target support substrate and/or the target coating formed by the fusion of the material powder, that is, to heat the spraying area, so that the material powder in the spraying area has sufficient ability to form and diffuse to achieve alloying and form the target coating of the required composition. The target support substrate is used to support the target coating formed by the material powder, and the size and shape of the target coating are controlled by moving the target support substrate, and the target coating is sprayed layer by layer, which is used for producing large-size, anomalous alloy target. The preparation device provided by the invention can obtain alloy targets with non-fixed, anomalous, and large-size, it overcomes the inhomogeneity of composition and density in the preparation process of traditional target materials and meets the special requirements of different coating scenes for target materials.

Figure 1:
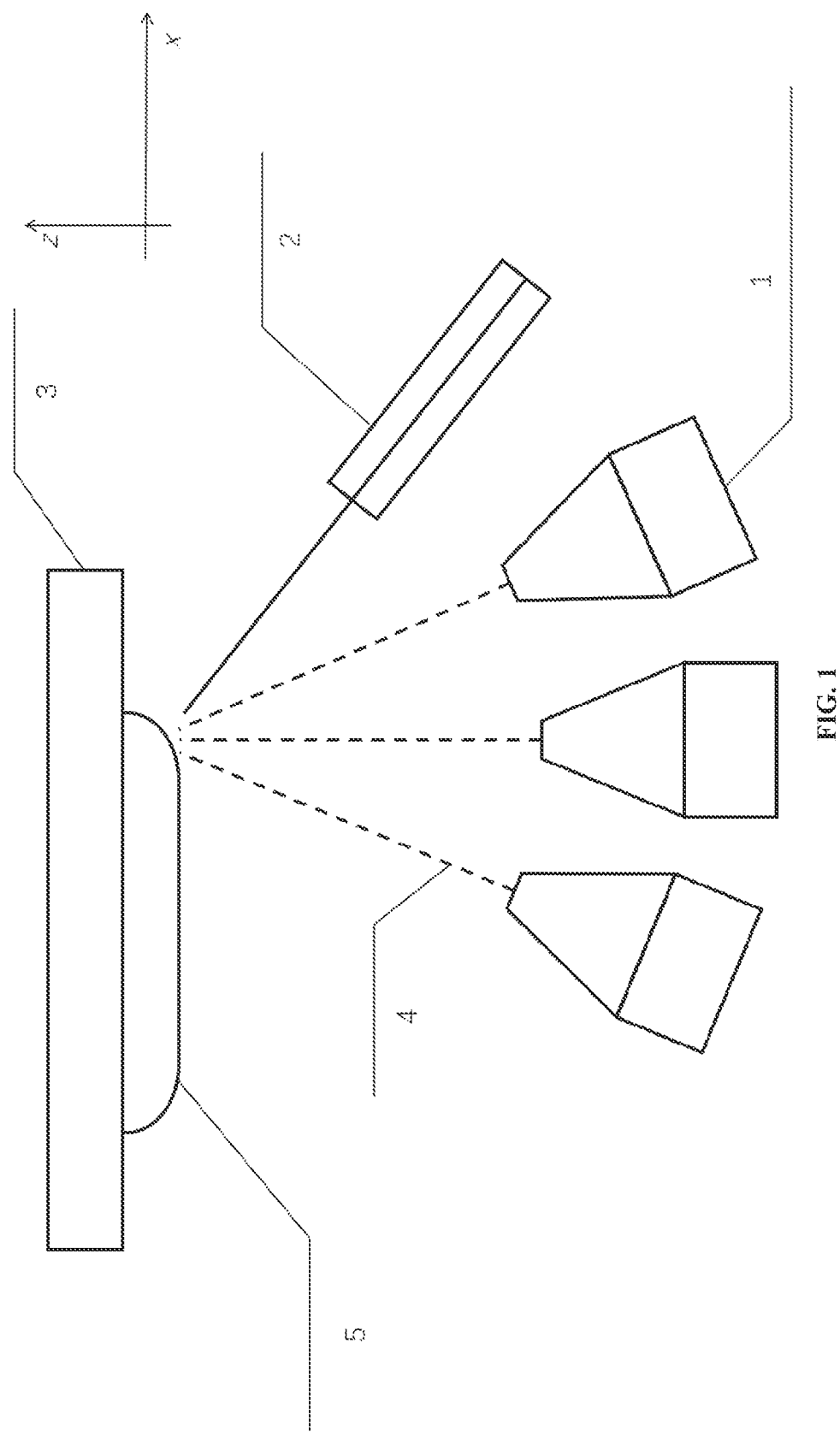
FIG. 1 is a structure diagram of the preparation device for alloy targets in the invention.
Figure 2:
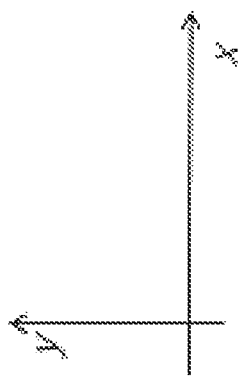
FIG. 2 is a schematic diagram of the focusing surface in the invention.
Figure 2:
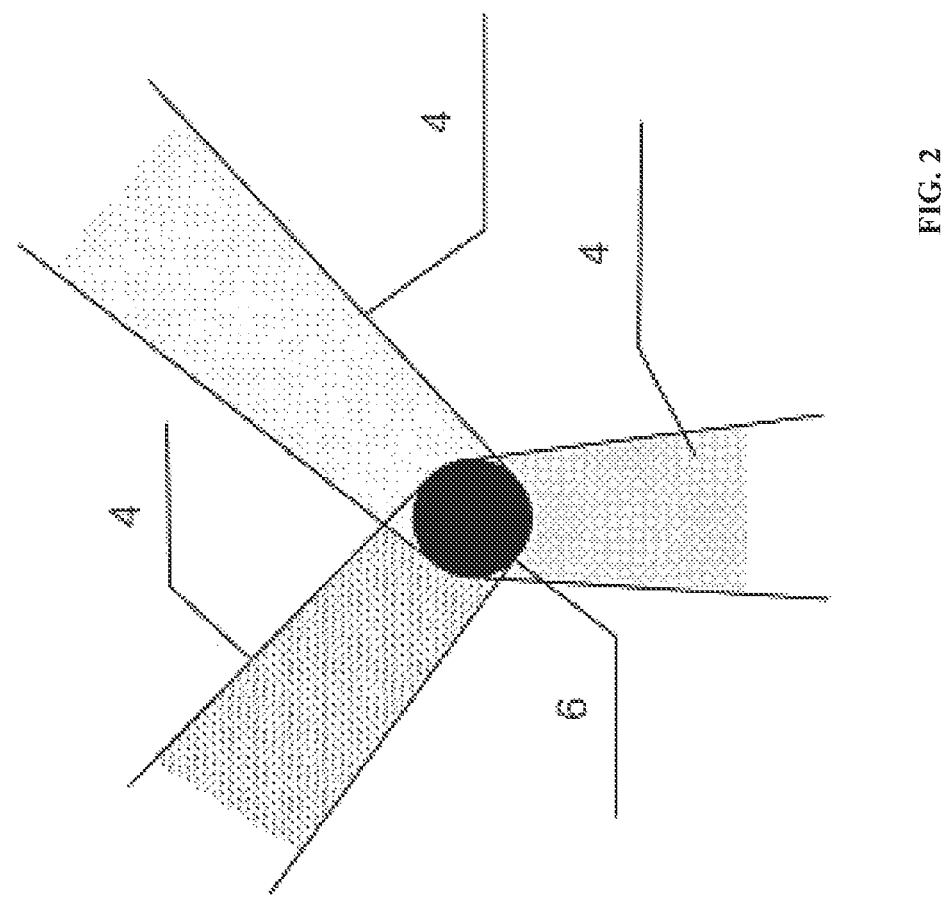
Figure 3:
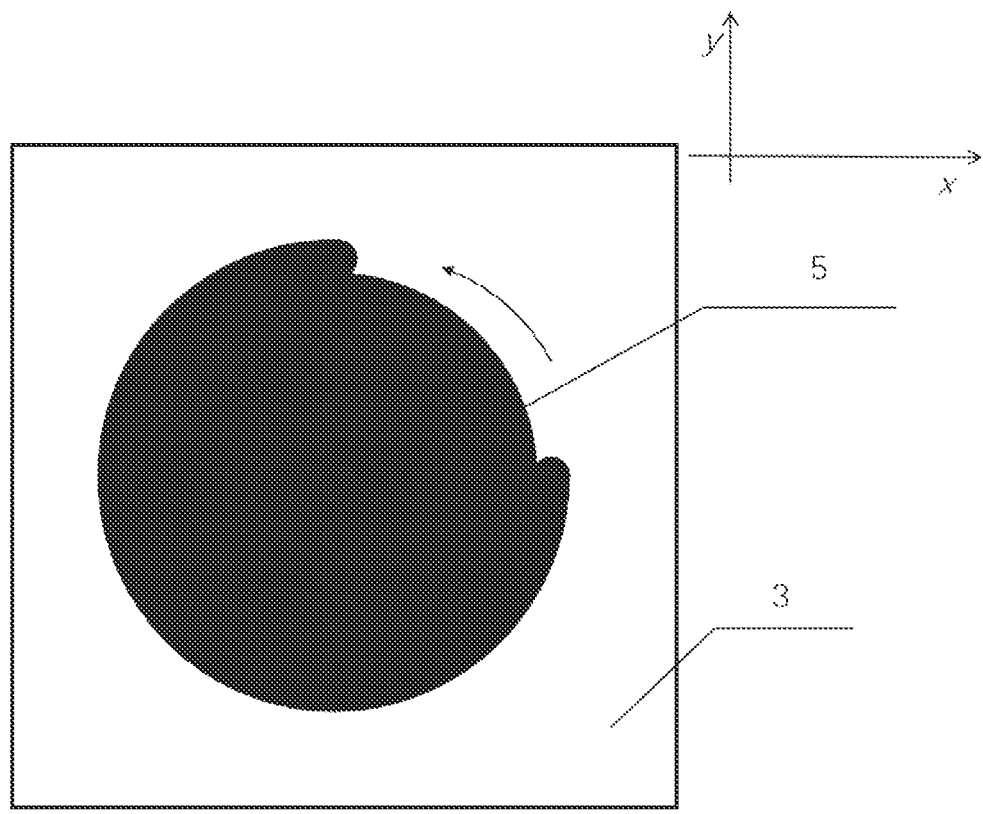
FIG. 3 is a schematic diagram of the positional relationship between the target coating and the target support substrate in the invention.

MARKS IN THE FIGURES 1, material nozzle; 2, high-energy laser; 3, target support substrate; 4, material powder; 5, target coating; 6, focusing surface; x, x-axis of three-dimensional space; y, y-axis of three-dimensional space; z, z-axis of three-dimensional space.

DETAILED DESCRIPTION OF THE EMBODIMENTS

The invention provides a preparation device for an alloy target, comprising the material nozzle 1, the high-energy laser 2, and the target support substrate 3;

the material nozzle 1 is arranged above the target support substrate 3, which is used to spray the material powder required for the alloy target to be prepared;

the high-energy laser 2 is arranged above the target support substrate 3 to generate the high-energy laser beam;

the target support substrate 3 supports the target coating formed by the material powder and controls the size and shape of the target coating.

As shown in FIG. 1, in the embodiment of the invention, the preparation device for alloy targets comprises the material nozzle 1. In the invention, the material nozzle 1 is preferably a Laval nozzle. In the invention, the number of the material nozzles 1 is preferably set according to the type of material powder required for the alloy target to be prepared, and more preferably 3-5 nozzles. In the invention, the injection efficiency of the material nozzle 1 is preferably independently adjusted. In this invention, the injection efficiency of the material nozzle 1 is preferably set according to the stoichiometric ratio of each element at a specific position of the alloy target to be prepared. In the invention, the spatial position and angle of the material nozzle 1 are preferably adjusted independently.

The invention independently adjusts the spatial position and angle of the material nozzle 1, and sets the injection efficiency of different material nozzles 1 according to the stoichiometric ratio of each element at a specific position of the alloy target to be prepared, so as to meet the requirements of doping certain specific positions in the film layer in the coating scene and realize the purpose of non-fixed composition of the alloy target.

As shown in FIG. 1, in the embodiment of the invention, the preparation device for alloy targets comprises the high-energy laser 2, the invention uses the high-energy laser beam generated by the high-energy laser 2 to heat the target support substrate, the material powder sprayed on the surface of the target support substrate 3 and/or the target coating formed by the fusion of the material powder, that is, to heat the spraying area, so that the material powder in the spraying area has sufficient ability to form and diffuse, the alloying is achieved, and the target coating of the required composition is formed.

As shown in FIG. 1, in the embodiment of the invention, the preparation device for alloy targets comprises the target support substrate 3, the invention uses the target support substrate 3 to support the target coating formed by the material powder, controls the size and shape of the target coating by moving the target support substrate 3, and sprays the target coating layer by layer, finally, it can produce large-size, anomalous alloy targets to meet the special needs of different coating scenarios.

In the invention, the preparation device for alloy targets also comprises the controller; the controller is connected to the material nozzle 1, the high-energy laser 2, and the target support substrate 3.

In the invention, the material nozzle 1, the high-energy laser 2, and the target support substrate 3 are preferably independently placed in a vacuum chamber containing an inert gas.

The invention also provides the preparation method for alloy targets, comprising the following steps:

(1) the required material powder is prepared according to the chemical element composition of the alloy target to be prepared;

(2) the material powder in Step (1) is divided and put into the material nozzle 1 of the preparation device described in the above technical solution, and then the spatial position and angle of the material nozzle 1 are adjusted independently, so that the position and area of the material nozzle 1 sprayed on the target support substrate 3 are consistent, and the focusing surface of the same position and size is obtained;

according to the stoichiometric ratio of each element at the specific position of the alloy target to be prepared, the injection efficiency of the material nozzle 1 is adjusted independently, and the high-energy laser 2 is turned on, the high-energy laser beam generated by the high-energy laser 2 is used to synchronously heat the material powder sprayed on the target support substrate 3 by the material nozzle 1, so that the material powder is fused to form the target coating;

in the process of the material powder injection, the target support substrate 3 is moved, and the target coating is formed with the required size and shape by spraying;

after the spraying of the above target coating is completed, the target support substrate 3 is moved, and the upper surface of the upper target coating is sprayed continuously to form the target coating with the required size and shape for the next layer, and the alloy target is obtained by spraying layer by layer.

The invention prepares the required material powder according to the chemical element composition of the alloy target to be prepared.

In the invention, the material powder is preferably a simple substance or an alloy. In this invention, the material powder is preferably micron-sized particles and/or nano-sized particles. The invention uses micron-sized particles and/or nano-sized particles as material powders, which has the advantage of short distance of element diffusion. At the same time, sufficient energy diffusion is obtained under the action of the auxiliary high-energy laser beam, and finally, the uniformity of composition and density of target coating obtained by spraying is good.

After obtaining the material powder, the material powder is divided and put into the material nozzle 1 of the preparation device described in the above technical solution, and then the spatial position and angle of the material nozzle 1 are adjusted independently, so that the position and area of the material nozzle 1 sprayed on the target support substrate 3 are consistent, and the focusing surface of the same position and size is obtained.

In the invention, the area of the focusing surface is preferably 1-100 $mm^2$. In the invention, the coincidence rate of the material nozzle 1 and the focusing surface is >95%. The invention controls the coincidence rate of the material nozzle 1 and the focusing surface in the above range to ensure that the material powders ejected from different material nozzles 1 are ejected at the same position on the focusing surface, which can diffuse to form an alloy with uniform composition, so as to avoid the decrease in the shape resolution and composition uniformity of the target caused by the oversized focusing surface, at the same time, the low efficiency of prepared target caused by undersized focusing surface is also avoided. By independently adjusting the spatial position and angle of the material nozzle 1, the position and area of the material nozzle 1 sprayed on the target support substrate 3 are consistent, and the focusing surface of the same position and size is obtained to ensure the uniformity of the composition and density of the target.

In the invention, when the alloy target is a periodically doped alloy target, the material nozzle is preferably provided with different focusing surfaces on the target support substrate; the injection mode of the material nozzle on different focusing surfaces is set, and the working time of different injection modes is adjusted to realize the preparation of the periodically doped alloy target.

In the invention, the working time of the different injection modes is preferably adjusted according to the superlattice structure of the target film prepared by the deposition of the periodically doped alloy target.

In the invention, the material nozzle 1 is preferably a Laval nozzle. The invention adjusts the injection efficiency of the material nozzle 1 by controlling the velocity of the working gas in the Laval nozzle. The invention independently adjusts the injection efficiency of the material nozzle 1 according to the stoichiometric ratio of each element at the specific position of the alloy target to be prepared, so that in the spraying area, the material powder ejected by different material nozzles 1 is consistent with the stoichiometric ratio of the chemical elements of the alloy target to be prepared, and finally the target target coating with non-fixed composition is obtained.

In the invention, the injection efficiency of the material nozzle 1 is independently preferably 0-100 $mm^3/s$. The invention controls the injection efficiency in the above range to ensure the uniformity of the target composition based on ensuring the target preparation efficiency and avoids the excessive injection efficiency that will limit the kinetic process of the element diffusion process, which is not suitable for preparing a target with uniform composition. At the same time, by adjusting the change of the injection efficiency of different material nozzles 1, the target with uniform composition change or periodic doping can be prepared.

The invention uses the high-energy laser beam produced by the high-energy laser 2 to synchronously heat the material nozzle 1 to spray the material powder on the target support substrate 3, so that the material powder is fused to form the target coating;

in the invention, the target support substrate 3 or the material nozzle 1 and the high-energy laser 2 are preferably moved in three-dimensional space. In this invention, the relative velocity of the movement is preferably 1-100 mm/s. The invention controls the relative speed of movement in the above range to take into account the efficiency and accuracy of target preparation and avoids the decrease in the accuracy of target shape caused by the excessive moving speed, and at the same time avoids the decrease in the efficiency of target preparation caused by the low moving speed.

In the invention, in the moving process, the focusing surface is preferably maintained on the plane of the target support substrate 3 to ensure the uniformity of the target coating composition.

After the cyclic layer-by-layer spraying is completed, the alloy target coating obtained by the cyclic layer-by-layer spraying is separated from the target support substrate 3 to obtain the alloy target.

The preparation method for alloy targets provided by the invention uses laser-assisted spraying and adopts an additive method to spray the target coating layer by layer, which can form the alloy target with a non-fixed composition, anomalous, and large size. At the same time, it overcomes the inhomogeneity of composition and density in the preparation process of traditional target materials and meets the special requirements of different coating scenes for target materials.

The technical solution in the invention will be clearly and completely described in the following combined with the embodiments. Obviously, the described embodiments are only parts of the embodiments of the invention, not all of the embodiments. Based on the embodiments in the invention, all other embodiments obtained by ordinary technicians in this field without making creative labor belong to the scope of protection of the invention.

Embodiment 1

The disk-shaped superconducting alloy target $YBa_2Cu_3$ with a diameter of 15 cm and a thickness of 1 cm is prepared by using the preparation device for alloy targets shown in FIG. 1, the preparation method is as follows:
 (1) according to the disk-shaped superconducting alloy target $YBa_2Cu_3$, the elemental Y powder, the elemental Ba powder, and the elemental Cu powder are prepared as three kinds of material powders;
 (2) the three material powders in Step (1) are divided and put into three material nozzles 1 of the preparation device for alloy targets, and then the spatial position and angle of the three material nozzles 1 are adjusted independently, so that the position and area of the three material nozzles 1 sprayed on the target support substrate 3 are consistent, and the focusing surface of the same position and size is obtained;
 according to the stoichiometric ratio of each element of the disk-shaped superconducting alloy target $YBa_2Cu_3$ (i.e., the alloy target to be prepared), the injection efficiency of the three material nozzles 1 for spraying the elemental Y powder, the elemental Ba powder, and the elemental Cu powder is adjusted to 19 $mm^3/s$, 78 $mm^3/s$, and 21.5 $mm^3/s$, respectively, and the high-energy laser 2 is turned on, the high-energy laser beam generated by the high-energy laser 2 is used to synchronously heat the material powder sprayed on the target support substrate 3 by the three material nozzles 1, so that the material powder is fused to form the target coating, and good uniformity is obtained under sufficient energy;
 in the process of the material powder injection, the target support substrate 3 is moved, and the circular target coating is formed with a required diameter of 15 cm by spraying;
 the preparation device for alloy targets also comprises a controller; the controller is connected to the material nozzles 1, the high-energy laser 2, and the target support substrate 3;
 the material nozzles 1, the high-energy laser 2, and the target support substrate 3 are independently placed in a vacuum chamber containing an inert gas;
 after the spraying of the upper target coating is completed, the target support substrate 3 is moved, and the upper surface of the upper target coating is continuously sprayed to form a circular target coating with a required diameter of 15 cm for the next layer, the disk-shaped superconducting alloy target $YBa_2Cu_3$ with a thickness of 1 cm is obtained by spraying layer by layer.

The relative velocity of the target support substrate 3 moving relative to the material nozzle 1 is 1 mm/s.

Embodiment 2

Figure 4:
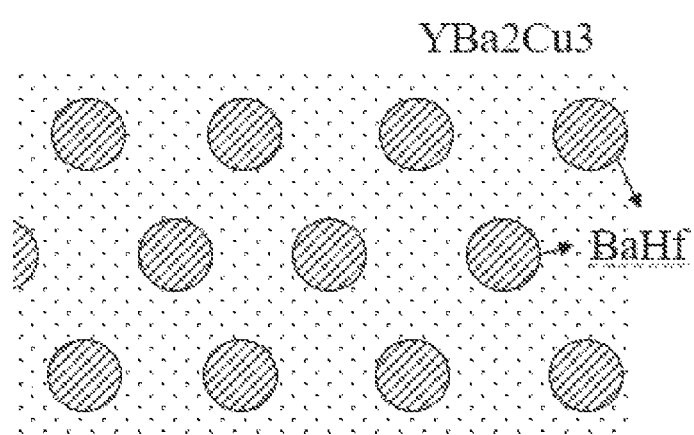
FIG. 4 is a microstructure diagram of BaHf doped superconducting alloy target $YBa_2Cu_3$ prepared by Embodiment 2 in the invention.

The disk-shaped BaHf-doped superconducting alloy target $YBa_2Cu_3$ with a diameter of 15 cm and a thickness of 1 cm is prepared by the preparation device for alloy targets shown in FIG. 1, which is used to deposit $YBa_2Cu_3O_7$+ $BaHfO_3$ superlattice films, the preparation method is as follows:
 (1) according to the disk-shaped BaHf doped superconducting alloy target $YBa_2Cu_3$, the elemental Y powder, the elemental Ba powder, the elemental Cu powder, and the elemental Hf powder are prepared as five kinds of material powders, of which the elemental Ba powder accounted for two parts;
 (2) the five material powders in Step (1) are divided and put into five material nozzles 1 of the preparation device for alloy targets, and then the spatial position and angle of the three material nozzles 1 with the elemental Y powder, the elemental Ba powder and the elemental Cu powder are adjusted independently, so that the position and area of the three material nozzles 1 sprayed on the target support substrate 3 are consistent, and the focusing surface of the same position and size is obtained; Then, the spatial position and angle of the remaining two material nozzles 1 with the elemental Ba powder and the elemental Hf powder are adjusted independently, so that the position and area of the two material nozzles 1 sprayed on the target support substrate 3 are consistent, and another focusing surface at the same position and size is obtained.
 according to the stoichiometric ratio of each element of $YBa_2Cu_3$ in the disk-shaped BaHf-doped superconducting alloy target $YBa_2Cu_3$ (i.e., the alloy target to be prepared), the injection efficiency of the three material nozzles 1 for spraying the elemental Y powder, the elemental Ba powder and the elemental Cu powder is adjusted to 19 $mm^3/s$, 78 $mm^3/s$ and 21.5 $mm^3/s$, respectively, the injection mode is set to mode A; according to the stoichiometric ratio of each element of BaHf in the disk-shaped BaHf-doped superconducting alloy target $YBa_2Cu_3$ (i.e., the alloy target to be prepared), the injection efficiency of the above-mentioned remaining two material nozzles 1 for the injection of elemental Ba powder and elemental Hf powder with another focusing surface is independently adjusted to 3.9 $mm^3/s$ and 3.9 $mm^3/s$, respectively, and the injection mode is set to mode B. The injection efficiency of the remaining two material nozzles 1 is 3.9 $mm^3/s$ and 3.9 $mm^3/s$, respectively, according to the superlattice structure required by the target film, the working time of mode A and mode B is adjusted to 1 s and 1 s respectively and cycled when working. The high-energy laser 2 is turned on, the high-energy laser beam generated by the high-energy laser 2 is used to synchronously heat the material powder sprayed on the target support substrate 3 by the five material nozzles 1, so that the material powder is fused to form the target coating, and good uniformity is obtained under sufficient energy; The microstructure diagram of the BaHf-doped superconducting alloy target $YBa_2Cu_3$ is shown in FIG. 4;
 in the process of the material powder injection, the target support substrate 3 is moved, and the circular target coating is formed with a required diameter of 15 cm by spraying;
 the preparation device for alloy targets also comprises a controller; the controller is connected to the material nozzles 1, the high-energy laser 2, and the target support substrate 3;

the material nozzles 1, the high-energy laser 2, and the target support substrate 3 are independently placed in a vacuum chamber containing an inert gas;

after the spraying of the upper target coating is completed, the target support substrate 3 is moved, and the upper surface of the upper target coating is continuously sprayed to form a circular target coating with a required diameter of 15 cm for the next layer, the disk-shaped BaHf-doped superconducting alloy target $YBa_2Cu_3$ with a thickness of 1 cm is obtained by spraying layer by layer.

The relative velocity of the target support substrate 3 moving relative to the material nozzle 1 is 1 mm/s.

The prepared target is applied to the pulse laser deposition process, the target is uniformly rotated during the deposition process, and the superlattice nanostructure of $YBa_2Cu_3O_7$ doped with $BaHfO_3$ is obtained, that is, the $YBa_2Cu_3O_7+BaHfO_3$ superlattice film.

Embodiment 3

A circular ring-shaped superconducting alloy target $YBa_2Cu_3$ with an outer diameter of 15 cm and an inner diameter of 13 cm is prepared by using the preparation device for alloy targets shown in FIG. 1 to improve the utilization rate of the target in the pulse laser deposition process. The preparation method is as follows:

(1) according to the disk-shaped superconducting alloy target $YBa_2Cu_3$, the elemental Y powder, the elemental Ba powder, and the elemental Cu powder are prepared as three kinds of material powders;

(2) the three material powders in Step (1) are divided and put into three material nozzles 1 of the preparation device for alloy targets, and then the spatial position and angle of the three material nozzles 1 are adjusted independently, so that the position and area of the three material nozzles 1 sprayed on the target support substrate 3 are consistent, and the focusing surface of the same position and size is obtained;

according to the stoichiometric ratio of each element of the disk-shaped superconducting alloy target $YBa_2Cu_3$ (i.e., the alloy target to be prepared), the injection efficiency of the three material nozzles 1 for spraying the elemental Y powder, the elemental Ba powder, and the elemental Cu powder is adjusted to 19 $mm^3/s$, 78 $mm^3/s$, and 21.5 $mm^3/s$, respectively, and the high-energy laser 2 is turned on, the high-energy laser beam generated by the high-energy laser 2 is used to synchronously heat the material powder sprayed on the target support substrate 3 by the three material nozzles 1, so that the material powder is fused to form the target coating and good uniformity is obtained under sufficient energy;

in the process of the material powder injection, the target support substrate 3 is moved, and the circular ring-shaped target coating is formed with a required diameter of 15 cm and an inner diameter of 13 cm.

the preparation device for alloy targets also comprises a controller; the controller is connected to the material nozzles 1, the high-energy laser 2, and the target support substrate 3;

the material nozzles 1, the high-energy laser 2, and the target support substrate 3 are independently placed in a vacuum chamber containing an inert gas;

after the spraying of the upper target coating is completed, the target support substrate 3 is moved, and the upper surface of the upper target coating is continuously sprayed to form a circular target coating with a diameter of 15 cm and an inner diameter of 13 cm for the next layer, the circular ring-shaped superconducting alloy target $YBa_2Cu_3$ with a thickness of 1 cm is obtained by spraying layer by layer.

The relative velocity of the target support substrate 3 moving relative to the material nozzle 1 is 1 mm/s.

It can be seen from the above that the preparation method of the alloy target provided by the invention, using laser-assisted spraying, using an additive method, and spraying the target coating layer by layer, can form a non-fixed, shaped, and large-sized alloy target. At the same time, it overcomes the inhomogeneity of composition and density in the traditional target preparation process and meets the special requirements of different coating scenarios for the target.

The above is only the preferred implementation method of the invention. It should be pointed out that for ordinary technicians in this technical field, some improvements and embellishments can be made without breaking away from the principle of the invention. These improvements and embellishments should also be regarded as the protection scope of the invention.

What is claimed is:

1. A preparation device for an alloy target, comprising a material nozzle, a laser, and a target support substrate;
    wherein the material nozzle is arranged above the target support substrate, the material nozzle is configured to spray material powder required for an alloy target to be prepared, and an injection efficiency of the material nozzle is 0-100 $mm^3/s$; the laser is arranged above the target support substrate to generate a laser beam;
    the target support substrate supports a target coating formed by the material powder and controls size and shape of the target coating; and
    the target coating is configured to be removable from the target support substrate.

2. The preparation device according to claim 1, wherein a number of material nozzles is 3 to 5.

3. The preparation device according to claim 1, wherein the preparation device for alloy targets further comprises a controller; the controller is connected to the material nozzle, the high-energy laser, and the target support substrate.

* * * * *